Dec. 3, 1968 J. D. HELMS ET AL 3,414,487

METHOD OF MANUFACTURING PRINTED CIRCUITS

Filed June 30, 1965 2 Sheets-Sheet 1

John D. Helms,
Herbert L. Brown Jr.,
Inventors.
Koenig, Senniger Powers and Leavitt,
Attorneys.

Dec. 3, 1968 J. D. HELMS ET AL 3,414,487

METHOD OF MANUFACTURING PRINTED CIRCUITS

Filed June 30, 1965 2 Sheets-Sheet 2

United States Patent Office 3,414,487
Patented Dec. 3, 1968

3,414,487
METHOD OF MANUFACTURING PRINTED CIRCUITS

John D. Helms and Herbert L. Brown, Jr., Dallas, Tex., assignors to Texas Instruments Incorporated, Dallas, Tex., a corporation of Delaware Filed June 30, 1965, Ser. No. 468,228
4 Claims. (Cl. 204—11)

This invention relates to the manufacture of circuitry and the like, and with regard to certain more specific features, to circuit boards and their auxiliaries useful in forming compact high-density microminiature circuitry.

Among the several objects of the invention may be noted the provision of circuit boards of the class described in which their circuit components present surfaces which are more nearly flush with the supporting surfaces of their insulating laminates, such circuit components being strongly attached to said laminates; the provision of improved methods and means for manufacturing such boards and their auxiliaries which avoid waste by limiting the amount of circuit foil required to that determined by the resuired outline of the circuits or like parts; the provision of improved methods and means for manufacturing the boards which avoid the need for etching of any circuitry on a board; and the provision of means for rapid and economical manufacture of circuit boards. Other objects and features will be in part apparent and in part pointed out hereinafter.

The invention accordingly comprises the elements and combinations of elements, steps and sequence of steps, features of construction, composition and manipulation, and arrangements of parts which will be exemplified in the constructions, products and methods hereinafter described, and the scope of which will be indicated in the following claims.

In the accompanying drawings, in which several of various possible embodiments of the invention are illustrated, FIGURE 1 is a diagrammatic illustration of an electrically conductive master plate used according to a batch process for carrying out the invention;

Corresponding reference characters indicate corresponding parts throughout the several views of the drawings.

Thicknesses of various thin layers and the spaces involved in carrying out the invention are exaggerated for clarity in description.

Heretofore, circuit boards have usually been prepared by adhering a sheet of conductive foil to an insulating substrate. A conventional masking photosensitive resist material was then coated on the conductive foil, dried, and then a negative of the desired circuit pattern applied thereto and exposed to light. This was followed by conventional development, after which that part of the photo-resist material not defining the circuit was removed. This exposed the underlying foil areas to be removed by etching. The unetched and unremoved conductive foil thus defined the desired circuit. This involved in the etching process the manipulation of the entire board, including its substrate, an undesirable condition. This also involved waste by etching away of a large portion of the initially applied foil. These and other disadvantages of this system are avoided by use of our new arrangements. The new system is also applicable to the production of other parts useful in microminiature circuitry, as will appear.

Figures 1, 2, 3, 4, 5, 6, 7, 8, 9, 10:
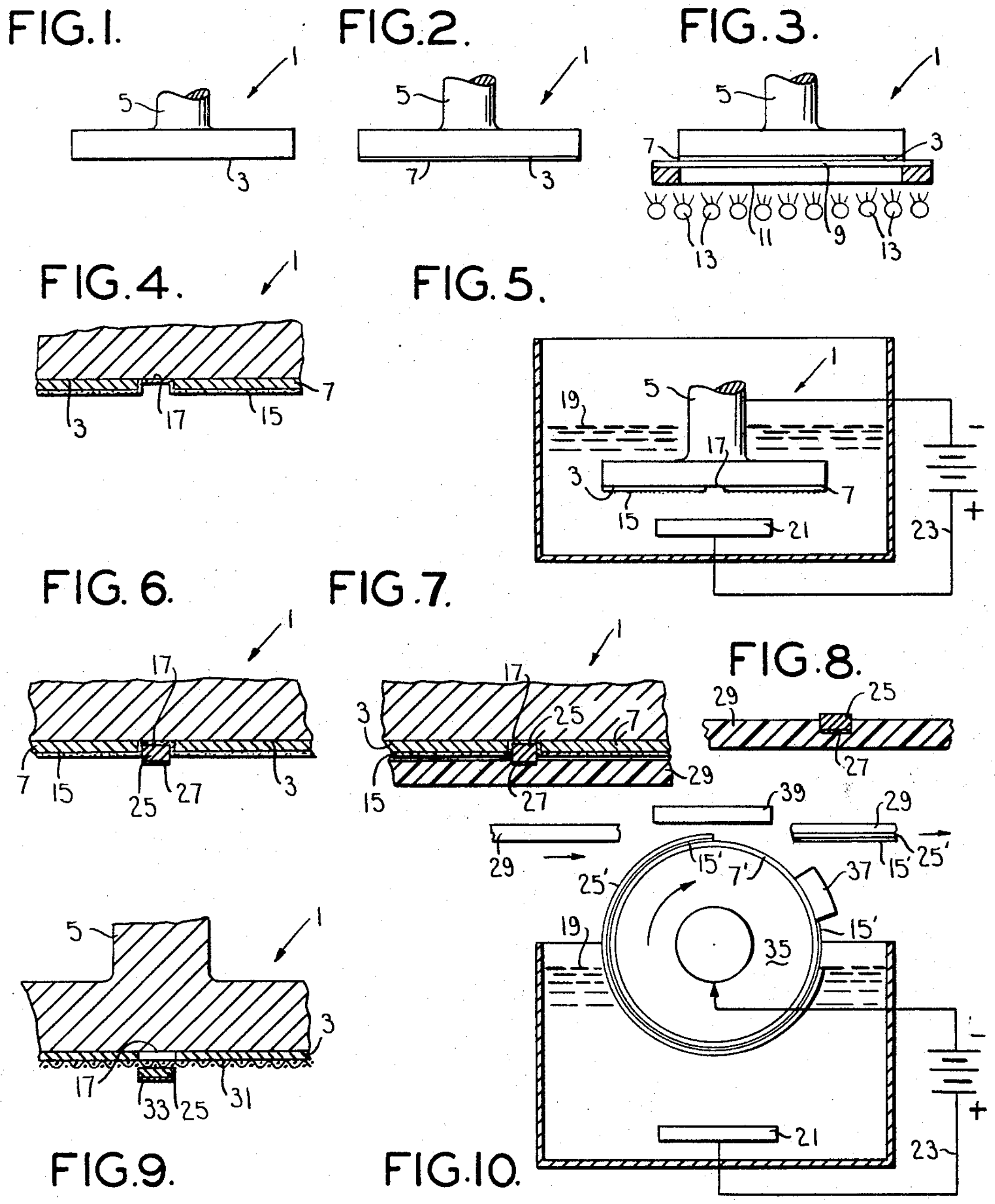
FIGURE 2 is a view similar to FIGURE 1, illustrating the application to the plate of a layer of photo-resist material.
FIGURE 3 is a view similar to FIGURE 2, showing the application of a photographic printer to the photo-resist layer and exposure of the latter to light through the printer.
FIGURE 4 is a greatly enlarged cross section illustrating the application to the photo-resist layer of the master plate, as printed, of a mold release layer.
FIGURE 5 is a diagrammatic view illustrating an electroplating step on the mold release layer.
FIGURES 6, 7 and 8 are enlarged diagrammatic cross sections illustrating succeeding steps.
FIGURE 9 is a view similar to FIGURE 6, illustrating another form of the invention.
FIGURE 10 is a diagrammatic view of an alternative process for carrying out the invention.

Referring now more particularly to FIGURE 1, there is shown a master plate 1 having an electrically conductive face portion 3 and a conductive terminal 5 electrically connected therewith. The plate may be composed of any suitable conductor such as steel, copper or the like. Conventional sensitized photo-resist material 7 (FIGURE 2) is applied to the face 3. This material is substantially nonconductive.

Next, as shown in FIGURE 3, a photographic master printer 9, defining the desired circuit pattern and carried on a frame 11, is applied to the sensitized resist layer 7. The layer is then exposed through the printer by means of lights 13. Then, after removal of the printer 9, the exposed photo-resist layer 7 is developed, fixed, and unwanted parts removed, so as to eliminate those portions of the resist which accord to the design of the circuit pattern. As shown in FIGURE 4, this leaves resist material 7 as a layer on the conductive face 3 covering all areas not defined by the circuit pattern. It also leaves areas 17 on the surface 3 which are not covered by the resist layer 7. These define the circuit pattern.

Then the entire face 3, with the prepared photo-resist layer 7 on it, is coated with a semiconductive mold release compound 15 (FIGURE 4). As shown in this figure, the mold release compound 15 covers both the remaining resist layer 7 and the circuit-forming open areas 17 therein which expose portions of the conductive face 3. The mold release compound is thinly applied by dipping, squeegee, spraying or the like. It is preferably constituted by a thermoplastic material which for the purpose will melt, for example, in the range of 170° F.–190° F.

Next, the master plate 1, as thus prepared with its photo-resist layer 7 and completely covered by the release compound 15 on its face 3 (see FIGURE 4), is submerged in a suitable copper or like electroplating bath 19, along with a corresponding plating electrode 21. A suitable circuit 23 for electroplating is connected across the terminal 5 and electrode 21. Assuming electrode 21 to be composed of copper, then copper ions will be selectively attracted to the face 3 in areas 17 and hence become selectively located on the photo-resist where, but only where, the latter covers the areas 17. The plated material is diagrammatically illustrated at 25 in FIGURE 6. Plating occurs according to the design of areas 17 and not elsewhere on the resist layer 7, because outside of the areas 17 the resistance against attraction of copper ions to face 3 is too high.

Next, the master plate 1, carrying the photo-resist layer 7, mold release material 15 and circuitry 25 plated on the latter, is placed in an appropriate oxidizing bath. In the case of copper, this may be an acid. The result is that the pattern 25 becomes oxidized on its exposed face, as illustrated at 27.

Next a suitable insulating substrate sheet 29 is obtained which, for example, may be composed of fiber glass impregnated with thermoactive epoxy resin. As shown in FIGURE 7, the assembly consisting of the master plate 1 carrying the photo-resist layer 7, the mold release material 15, and the conductive circuit pattern 25, oxidized as at 27, is advanced under heat and pressure to the face of the substrate 29, thus squeezing the plated pattern 25 into the substrate 29. This is shown in mid process in FIGURE 7. The oxidized surface 27 effects a strong bond between the circuit pattern 25 and the substrate. It will be understood that in some cases the oxidizing step may be omitted and the squeezing carried out without the oxidized surface 27, if the stronger oxide bond is not required.

After pressurization, the plate 1 is retracted, leaving the circuit pattern 25 pressed into and strongly attached to the substrate 29. The mold release material 15 remains adhered to the resist layer 7, ready for repetition of the plating and oxidizing cycles of events. In some cases it, or some of it, may adhere to the board 29 and circuit pattern 25, in which event it is cleaned off by a suitable solvent. The result is as shown in FIGURE 8. If any of the mold release material adheres to the resist layer 7 and face 3, it must be cleaned off and a fresh layer of mold release material applied before the plating and oxidizing cycles are repeated.

One advantage of the process is that the upper surfaces of the circuit-plated pattern 25 are near to the surface of the substrate. Heretofore they were not so close because the circuit-forming parts were merely attached to the board surface, rather than being pressed therein. The final result is a substrate 29 with the pressed-in circuit pattern 27 as illustrated in FIGURE 8.

An advantage of our process is the avoidance of any etching away of large amounts of solid conductive foil preapplied to a substrate, to produce the desired circuit pattern. This is avoided by plating only the circuit pattern portions on the master 1 and transferring them to the substrate. This conserves circuit-forming material because none is wasted in etching away unwanted portions from foils. Moreover, the circuit-forming pattern 25, as constructed on the master 1, can be squeezed into the surface of the substrate 29 so as to force the upper surface of the pattern close to the upper surface of the substrate. This is not possible when a foil is first pressed in sheet form against the substrate and then etched, which leaves a much higher surface on the circuit-forming pattern with respect to substrate surface.

In FIGURE 9 is shown a form of the invention in which a sheet of fine-mesh nylon or fiber glass 31 is used as a substitute for the mold release compound 15 shown in FIGURES 4–7. In this case (referring to FIGURE 9) the masking photo-resist layer 7 is again placed on the master plate 1, exposed, developed, fixed and circuit-outlining parts removed to bring about exposed areas such as shown at 17. Then the nylon mesh 31 is held against the photo-resist layer 7 and the entire assembly immersed in a plating bath. This results in the accretion of circuit-forming plating 25 on the part of the nylon spanning the exposed areas 17. This may be then placed in an oxidizing bath for oxidation as at 33. Thereafter the assembly may be forced against a suitable substrate such as 29 under heat and pressure, thereby adhering the circuit-forming pattern 25 to the substrate, as already made clear. Upon retraction of the plate 1, the nylon mesh layer 31 is stripped away from the substrate.

The above description relates to batch methods for carrying out the inveniton. It may laso be carried out by continuous operations, one of which is illustrated in FIGURE 10, like numerals indicating like parts. In this form of the invention, a conductive drum 35 is provided which takes the place of the plate 1. This drum 35 carries on its surface the masking photo-resist layer 7′ from which parts have been removed in the shape of the circuit to be formed, as above described in connection with layer 7 of the plate 1. At numeral 37 is a mold release applicator for applying a mold release layer 15′ to the layer 7′, similar to the application shown in FIGURE 4.

The drum 35 is mounted for rotation of its surface into a plating bath 19 in which is a plating electrode 21. At numeral 39 is a fixed heated sole plate, between which and the drum may be fed the substrate sheet 29. Rotation of the drum is in the direction shown by the arrow. In operation, the applicator 37 continuously applies the mold release material to the prepared photo-resist material 7′ on the drum 35. Plating takes place continuously in the bath 19 as the drum rotates down into it on one side. The surface of the drum on the other side continuously emerges from the plating material in the form of the circuit-forming pattern 25 on the release layer 15′. This circuit-forming material, along with the mold release material, is transferred to the substrate 29 as the latter is fed from left to right between the sole plate and the roll 35. This leaves the resist layer 7′ again to rotate down into the plating solution 19 after again receiving an application of mold release material 15′ from the applicator 37. The material 15′ on the board 29 is removed therefrom before use.

Figures 11, 12, 13, 14:
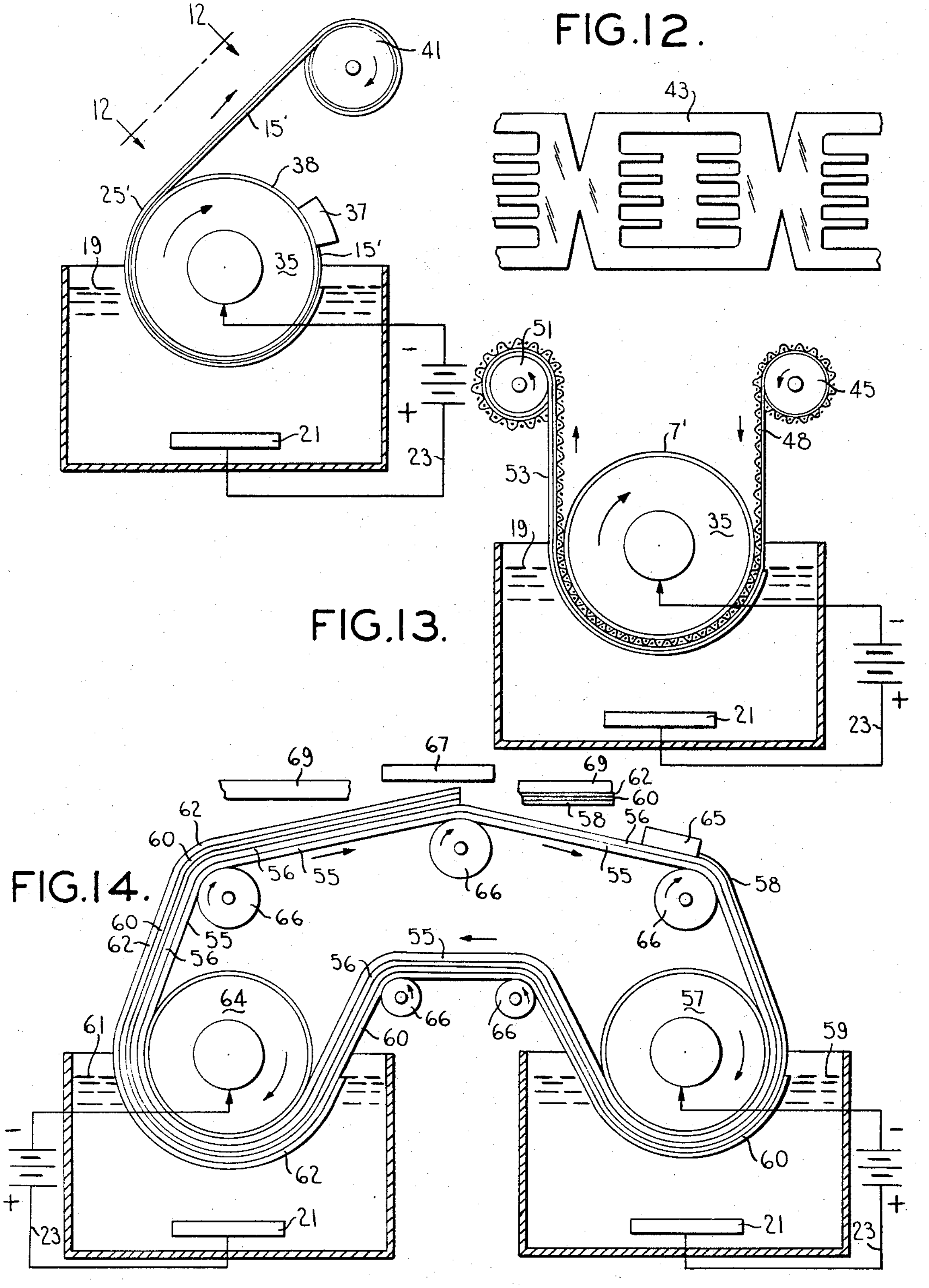
FIGURE 11 is a view similar to FIGURE 10, illustrating another alternative process.
FIGURE 12 is a diagrammatic view of a typical strip obtained by means of the FIGURE 10 process, being taken on line 12—12 of FIGURE 11.
FIGURES 13 and 14 are diagrammatic views similar to FIGURE 11, showing other alternative processes for carrying out the invention.

In FIGURE 11 is shown another form of the invention in which numeral 35 shows a conductive roll again carrying a masking patterned resist coating, here numbered 38, continuously covered with a mold release compound 15′ by an applicator 37. This roll rotates as shown by the arrow, so as continuously to immerse the coating 38 covered by release compound 15′ in an electroplating bath 19. The result is a formation on the roll 35 of the desired electroplated pattern, which is stripped from the drum 35 and led up to a wind-up roll 41. It carries with it the mold release material 15′ which is later removed. FIGURE 12 illustrates an example of the resulting metal strip product 43 for any desired use. In this case the plated pattern is not to be pressed into a substrate but to be used for other purposes.

Referring to FIGURE 13, there is shown another form of the invention in which numeral 35 is again a conductive roll carrying on its surface the masking photo-resist 7′. At numeral 45 is shown a supply reel for a strip of nylon or fiber glass mesh 47 surface-impregnated with a mold release compound (see line 48). This strip is fed over the surface of the roll 35 under rotation in the direction shown by the arrow. The lower part of the drum is immersed in an electroplating bath 19, which plates the desired circuit pattern on the face of the nylon mesh strip 47. At numeral 51 is shown a takeup reel which strips from the roll 35 the nylon strip 47 carrying the plated pattern indicated at 53, which later may be stripped away for use.

In FIGURE 14 is shown another form of the invention in which a conductive metal foil strip 55 carries a photo-resist masking layer 56. To this layer 56 is applied a mold release material 58 by applicator 65. This composite 55, 56, 58 is guided by a roll 57 into a first electrolytic plate bath 59 wherein it picks up a layer of plating 60. It then moves over a roll 64 into a second bath 61, in which it picks up a second plated layer 62, which improves the plating. Rolls 57 and 64 rotate in the direction shown, thus moving the master strip 55 in the direction shown. At numeral 67 is a fixed heated sole plate, between which and an upper one of several guide rolls 66 is fed substrate material indicated at 69, onto which is transferred the plated material 60, 62, along with the mold release material 58 which is later removed.

In view of the above, it will be seen that in all forms of the invention a conductive electrode of suitable form is provided, such as a metal plate or a cylinder. On this is prepared the masking layer in which are delineated openings exposing the electrode according to the pattern of the circuit or the like to be produced. The masking layer and the exposed portions of the master electrode are covered with a releasing layer. In response to electroplating, those portions of the releasing layer which overlie the unremoved parts of the masking layer have therewith a total resistance preventing plate on the releasing layer, whereas the mold releasing compound per se over the holes in the masking layer has less resistance and does not interfere with the ion-attracting effect of the underlying exposed electrode portions. Thus the circuit or like pattern is in effect implaced or molded upon the releasing layer from which it is later released.

The subjection of the plated material while on the release layer to the oxidizing bath to provide an oxide layer on the plated pattern is preferable, but in some cases may be omitted. It will be seen that in some cases, as in FIGS. 1–8, it is preferable that the mold releasing layer remain attached to the masking layer after application and removal of the plated pattern. In other cases, such as shown in FIGS. 10–14, upon removal of the plated pattern the releasing layer may strip away from the masking layer, the latter receiving a new application of the mold releasing compound for subsequent electroplating events as they occur. In such event the release compound is removed from the electroplated product.

In view of the above, it will be seen that the several objects of the invention are achieved and other advantageous results attained.

As various changes could be made in the above constructions, products and methods without departing from the scope of the invention, it is intended that all matter contained in the above description, or shown in the accompanying drawings, shall be interpreted as illustrative and not in a limiting sense.

What is claimed is:

1. The method of producing a conductive pattern comprising applying to a conductive face a masking layer, removing portions of the masking layer to form therein openings which expose portions of said conductive face according to said pattern, applying a releasing layer over the masking layer and said openings, immersing the face with the masking and releasing layers thereon in an electroplating bath wherein the face is the negative pole, the total resistance of the masking and releasing layers in areas where they coexist on the face preventing electroplating over such areas on the releasing layer, the releasing layer being of less resistance than said total resistance so that where it alone covers the conductive face over the openings it becomes plated with conductive material in response to the negative polarity of the face areas in the openings, and thereafter separating the plated pattern and the releasing layer.

2. The method of producing a circuit board comprising applying to a conductive face a masking layer, removing portions of the masking layer to form therein openings which expose portions of said conductive face according to a pattern, applying a releasing layer over the masking layer and said openings, immersing the face with the masking and releasing layers thereon in an electroplating bath wherein the face is the negative pole, the total resistance of the masking and releasing layers in areas where they coexist on the face preventing electroplating over such areas on the releasing layer, the releasing layer being of less resistance than said total resistance so that where it alone covers the conductive face over the openings it becomes plated in the form of said pattern in response to the negative polarity of the face areas in the openings, oxidizing the plated pattern so formed, squeezing the plated pattern into a substrate to join them, and thereafter separating the substrate and its joined plated pattern from the releasing layer.

3. The method of constructing a circuit board comprising applying a masking layer to a conductive face, removing portions of the masking layer to form openings according to a pattern, applying a releasing layer over the masking layer and said openings, inserting the face with the masking and releasing layers thereon into an electroplating bath, whereby a conductive pattern is plated on the releasing layer in areas according to said pattern, subjecting the plated pattern to oxidation while on the releasing layer, pressing the assembly of the plate, masking and releasing layers with the plated pattern thereon against a substrate to force the pattern thereinto, and retracting the face with its masking and releasing layers from the substrate, leaving the patterned plated material thereon.

4. The method of constructing a circuit board comprising applying a masking layer to a conductive face, removing portions of the masking layer to form openings according to a pattern, applying a releasing layer over the masking layer and said openings, inserting the face with the masking and releasing layers thereon into an electroplating bath, whereby a conductive pattern is plated on the releasing layer in areas according to said pattern, subjecting the plated pattern to oxidation while on the releasing layer, pressing the assembly of the plate, masking and releasing layers with the plated pattern thereon against the surface of a substrate to force the pattern thereinto, and retracting the face with its masking layer from the substrate, leaving the patterned plated material thereon with its outer surface a distance away from the surface of the substrate which is less than the thickness of the plated pattern.

References Cited

UNITED STATES PATENTS

| | | | |
|---|---|---|---|
| 2,745,898 | 5/1956 | Hurd | 204—38 |
| 2,884,571 | 4/1959 | Hannahs | 204—12 |
| 3,024,151 | 3/1962 | Robinson | 204—15 |

FOREIGN PATENTS

| | | |
|---|---|---|
| 591,291 | 1/1960 | Canada. |
| 601,488 | 7/1960 | Canada. |
| 847,614 | 9/1960 | Great Britain. |

HOWARD S. WILLIAMS, *Primary Examiner.*

T. TURFARIELLO, *Assistant Examiner.*